(12) United States Patent
Mlinar

(10) Patent No.: US 10,931,902 B2
(45) Date of Patent: Feb. 23, 2021

(54) IMAGE SENSORS WITH NON-RECTILINEAR IMAGE PIXEL ARRAYS

(71) Applicant: SEMICONDUCTOR COMPONENTS INDUSTRIES, LLC, Phoenix, AZ (US)

(72) Inventor: Marko Mlinar, Horjul (SI)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/974,507

(22) Filed: May 8, 2018

(65) Prior Publication Data

US 2019/0349542 A1 Nov. 14, 2019

(51) Int. Cl.
*H04N 5/225* (2006.01)
*H01L 27/146* (2006.01)
(Continued)

(52) U.S. Cl.
CPC ......... *H04N 5/367* (2013.01); *G02B 27/0025* (2013.01); *H01L 27/14643* (2013.01);
(Continued)

(58) Field of Classification Search
None
See application file for complete search history.

(56) References Cited

U.S. PATENT DOCUMENTS

| | | |
|---|---|---|
| 5,311,337 A | 5/1994 | McMcartney |
| 5,416,515 A * | 5/1995 | Arai .................... H04N 5/23212 348/229.1 |

(Continued)

FOREIGN PATENT DOCUMENTS

| | | |
|---|---|---|
| EP | 1389876 A1 | 2/2004 |
| EP | 2738812 A1 | 6/2014 |
| WO | 2012033578 A1 | 6/2012 |

OTHER PUBLICATIONS

Yabushita, A. and Ogawa. K., "Image reconstruction with a hexagonal grid", IEEE Nuclear Science Symposium Conference Record, 3, 1500-1503 (2002).

(Continued)

*Primary Examiner* — Mark T Monk
(74) *Attorney, Agent, or Firm* — Treyz Law Group, P.C.; David K. Cole

(57) ABSTRACT

An image sensor may include a non-rectilinear image pixel array, which may produce non-rectilinear image data. The image sensor may include a resampling circuit to convert the non-rectilinear image data into rectilinear image data that is optimized for displaying an image to a user. This image data may be corrected using defect correction circuitry, resilience filtering circuitry, and aberration correction circuitry in the image sensor, and demosaicking circuitry and color correction circuitry in an image signal processor that is coupled to the image sensor. Alternatively, the non-rectilinear image data may be sent to the image signal processor without converting it to rectilinear image data. For example, machine vision applications may use and interpret non-rectilinear image data directly. In these applications, the image sensor and image signal processor may include fewer components, as the resilience filtering circuit, resampling circuit, aberration correction circuit, demosaicking circuit, and color correction circuit may be unnecessary.

11 Claims, 12 Drawing Sheets

(51) Int. Cl.
    *G02B 27/00*     (2006.01)
    *H04N 5/367*     (2011.01)
    *H04N 5/376*     (2011.01)
    *H04N 9/64*      (2006.01)

(52) U.S. Cl.
    CPC .......... *H04N 5/2254* (2013.01); *H04N 5/376* (2013.01); *H04N 9/64* (2013.01)

(56) References Cited

U.S. PATENT DOCUMENTS

| | | | |
|---|---|---|---|
| 7,382,010 | B2 | 6/2008 | Chio |
| 7,414,630 | B2 | 8/2008 | Schweng et al. |
| 7,511,323 | B2 | 3/2009 | Mckee |
| 2004/0105021 | A1 | 6/2004 | Hu |
| 2004/0114047 | A1* | 6/2004 | Vora ............... H04N 9/045 348/340 |
| 2006/0146064 | A1 | 7/2006 | Schweng et al. |
| 2006/0146067 | A1 | 7/2006 | Schweng et al. |
| 2007/0018073 | A1 | 1/2007 | Hsu et al. |
| 2007/0171290 | A1 | 7/2007 | Kroger |
| 2008/0018765 | A1 | 1/2008 | Choi et al. |
| 2009/0128671 | A1 | 5/2009 | Kusaka |
| 2014/0160326 | A1* | 6/2014 | Black ............... H04N 9/045 348/262 |
| 2015/0070528 | A1* | 3/2015 | Kikuchi ............ H04N 9/07 348/224.1 |
| 2015/0311242 | A1* | 10/2015 | Bai ............... H01L 27/1461 348/164 |
| 2015/0350583 | A1 | 12/2015 | Mauritzson et al. |
| 2016/0150175 | A1 | 5/2016 | Hynecek |
| 2017/0064221 | A1* | 3/2017 | Taylor ............... H04N 5/332 |
| 2017/0318211 | A1* | 11/2017 | Ueki ............... H04N 5/232 |
| 2017/0324917 | A1 | 11/2017 | Mlinar et al. |
| 2017/0366769 | A1 | 12/2017 | Mlinar et al. |

OTHER PUBLICATIONS

Middleton, L. and Sivaswamy. J., "Edge detection in a hexagonal-image processing framework", Image and Vision Computing, 19(14), 1071-1081 (2001).

Middleton, L. and Sivaswamy.J., "Framework for practical hexagonal-image processing", Journal of Electronic Imaging, 11(1), 104-114 (Jan. 1, 2002). doi:10.1117/1.1426078.

Qiang Wu, Xiangjian He, Tom Hintz, "Image segmentation on spiral architecture", Proceedings of the Pan-Sydney area workshop on Visual information processing , Australian Computer Society Inc, 11(1), (2001).

Luczak, E. and Rosenfeld, A., "Distance on a Hexagonal Grid". IEEE Transactions on Computers, 25(5),532-533 (1976).

Staunton, Richard C. and Storey Neil, "A comparison between square and hexagonal sampling methods for pipeline image processing", Proc. SPIE, vol. 1194, 142-151 (1989).

Alexander Fröhlich and Andreas Unterweger "A novel color filter array and demosaicking algorithm for hexagonal grids", Proc. SPIE 9443, Sixth International Conference on Graphic and Image Processing (ICGIP 2014), 94432T (Mar. 4, 2015); doi:10.1117/12.2179849.

Vaartstra et al., U.S. Appl. No. 15/488,646, filed Apr. 17, 2017.

* cited by examiner

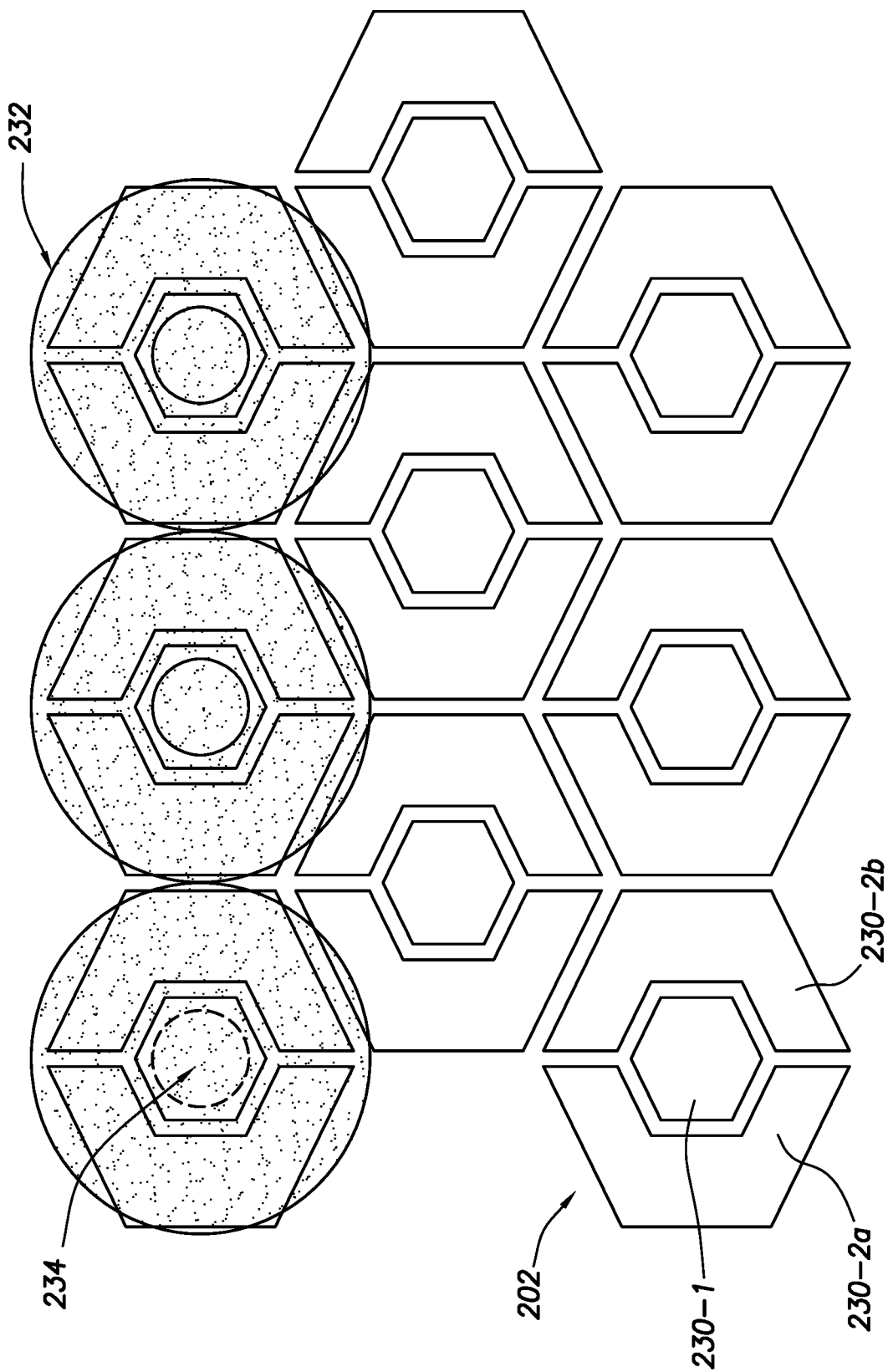

IMAGE SENSORS WITH NON-RECTILINEAR IMAGE PIXEL ARRAYS

BACKGROUND

This relates generally to imaging devices, and more particularly, to imaging devices with non-rectilinear image sensor pixel arrays.

Image sensors are commonly used in electronic devices such as cellular telephones, cameras, and computers to capture images. In a typical arrangement, an electronic device is provided with an image sensor having an array of image pixels arranged in pixel rows and pixel columns. Circuitry is commonly coupled to each pixel column for reading out image signals from the image pixels.

Conventional imaging systems employ an image sensor in which the visible light spectrum is sampled by red, green, and blue (RGB) image pixels arranged in a rectilinear Bayer mosaic pattern. However, imaging systems that employ rectilinear pixel arrays are difficult to manufacture, resulting in compromises that reduce the efficiency and performance of such systems.

It would therefore be desirable to be able to provide imaging devices with improved efficiency and performance.

BRIEF DESCRIPTION OF THE DRAWINGS

FIG. 2D is a diagram showing of illustrative high dynamic range (HDR) hexagonal pixels in accordance with at least some embodiments.

DETAILED DESCRIPTION

Embodiments of the present invention relate to image sensors having non-rectilinear image sensor pixel arrays.

Figure 1:
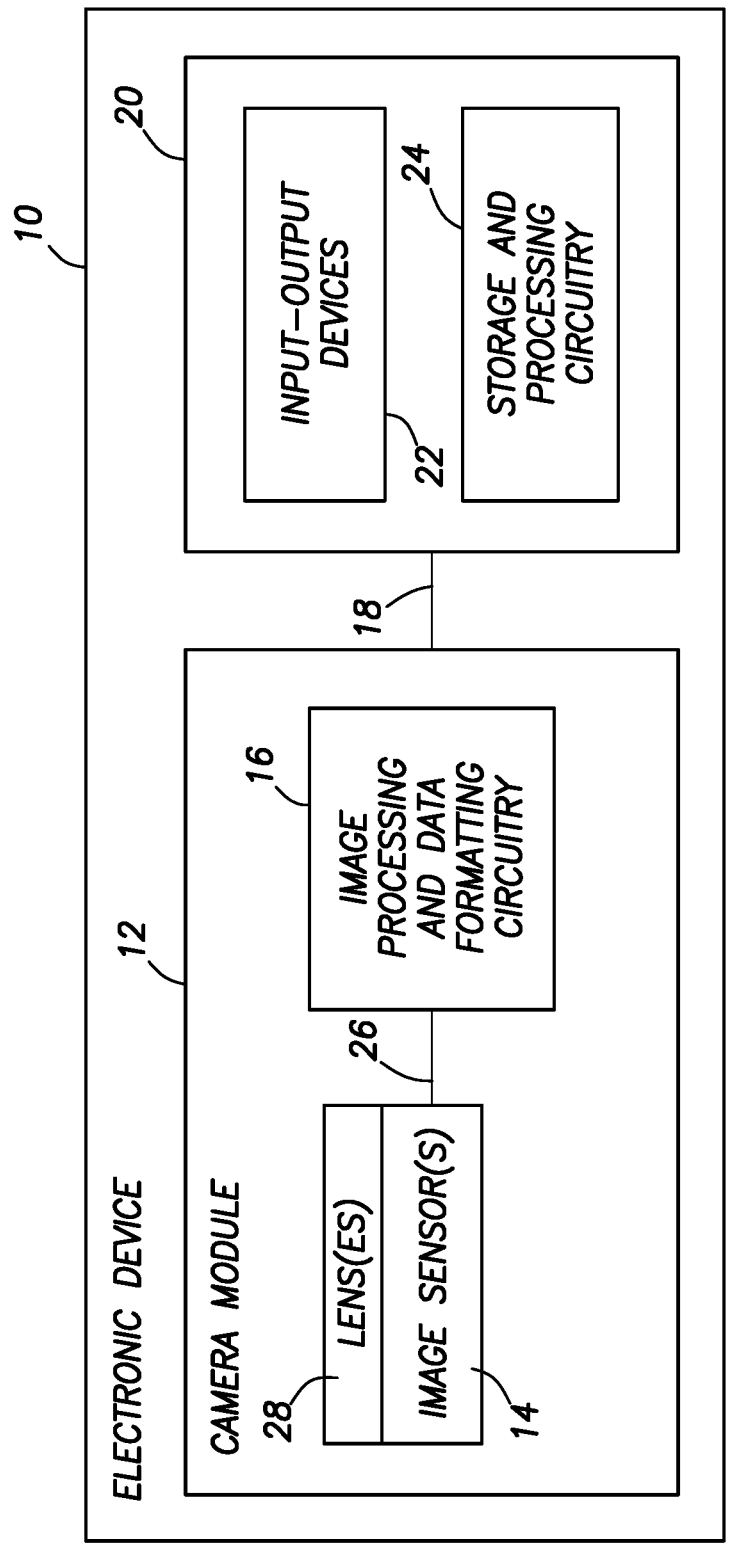
FIG. 1 is a schematic diagram of an illustrative electronic device with an image sensor that may include phase detection pixels in accordance with an embodiment.

An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit.

The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits. If desired, camera sensor 14 and image processing circuitry 16 may be formed on separate semiconductor substrates. For example, camera sensor 14 and image processing circuitry 16 may be formed on separate substrates that have been stacked.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Image sensors may sometimes be provided with high dynamic range functionalities (e.g., to use in low light and bright environments to compensate for high light points of interest in low light environments and vice versa). To provide high dynamic range functionalities, image sensor 14 may include high dynamic range pixels.

Image sensors may also be provided with depth sensing capabilities (e.g., to use in automatic focusing applications, 3D imaging applications such as machine vision applications, etc.). To provide depth sensing capabilities, image sensor 14 may include phase detection pixel groups. If desired, pixel groups that provide depth sensing capabilities may also provide high dynamic range functionalities.

Image sensors may contain pixels that are arranged in an array. Typically, rectilinear image pixel arrays are used. The pixels in rectilinear image pixel arrays may be aligned in a grid. Specifically, rectilinear image pixel arrays may include image pixels in rows and columns. Adjacent image pixels may have centers that are aligned, forming a rectangular grid. However, rectilinear image pixel arrays may be difficult to manufacture and produce image data that is difficult to process (e.g., the image data may be blurred on the edges of the array).

To provide enhanced efficiency and performance, image sensors may have non-rectilinear image pixel arrays. The image pixels in non-rectilinear image pixel arrays are not aligned in a perfect rectangular grid and are offset with respect to the pixels in rectilinear image pixel arrays. Illustrative non-rectangular or non-rectilinear image pixel arrays and image pixels that may be used are shown in FIGS. 2A-2E.

Figure 2A:
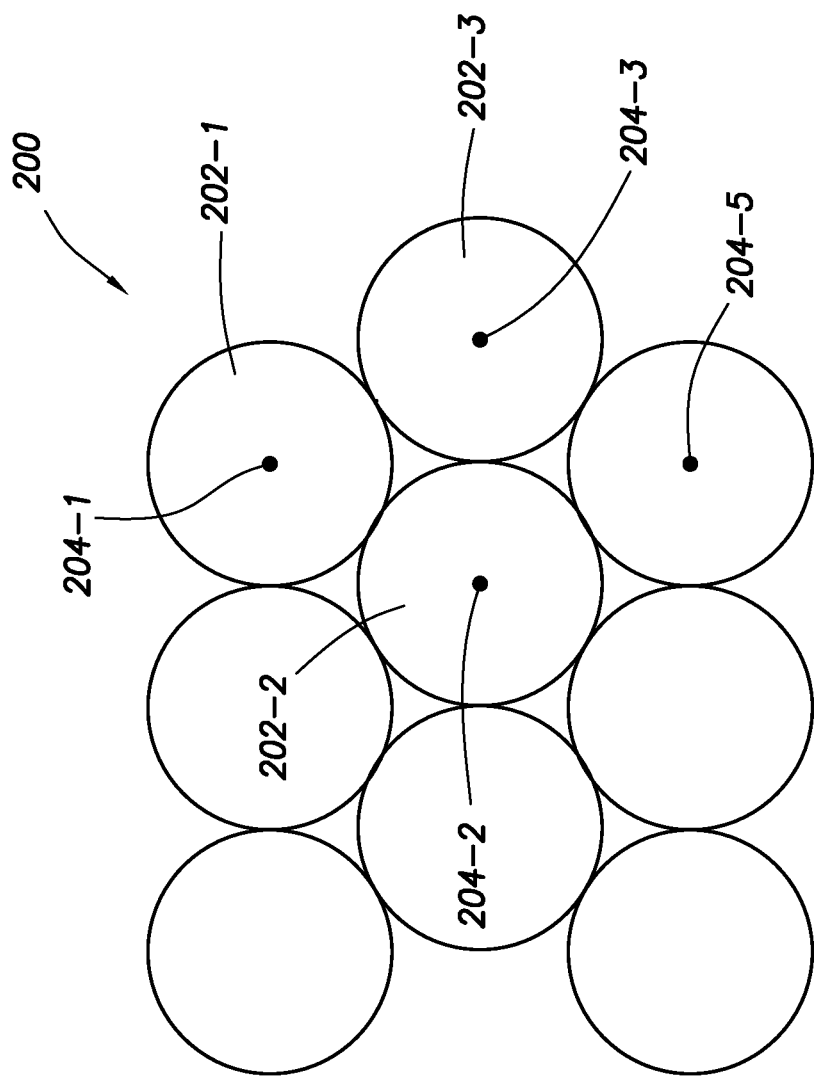
FIG. 2A is a diagram of an illustrative non-rectilinear pixel array in accordance with an embodiment.
Figure 2B:
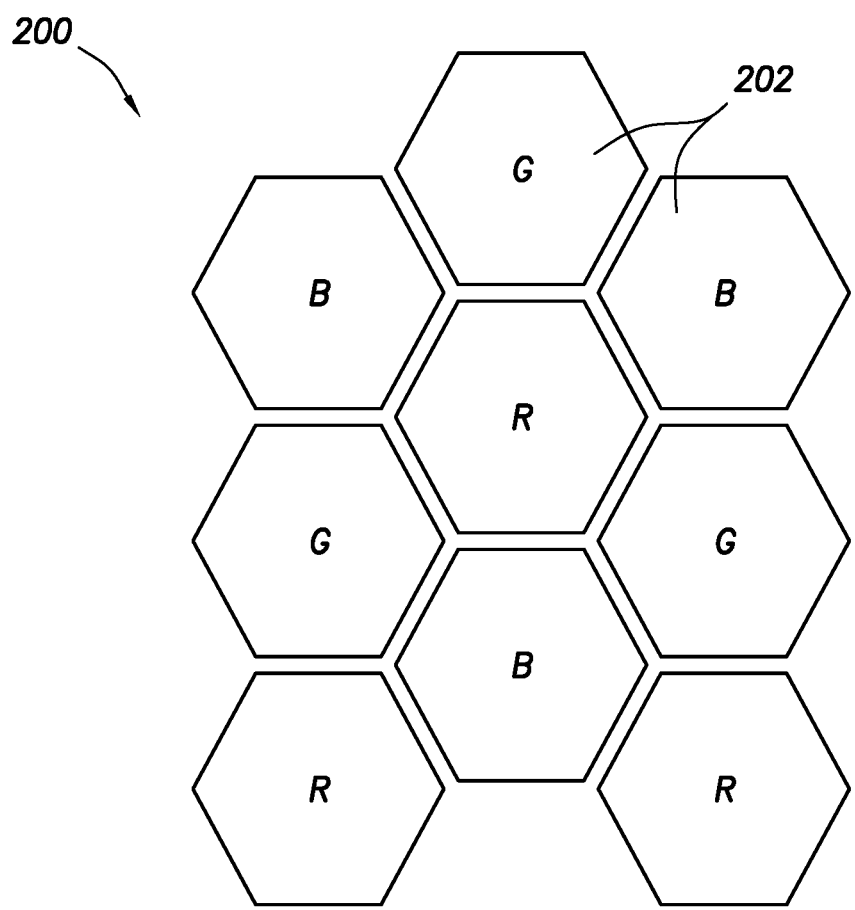
FIG. 2B is a diagram of an illustrative hexagonal (non-rectilinear) pixel array in accordance with an embodiment.

FIG. 2A is an illustrative diagram of non-rectilinear image pixel array 200. Non-rectilinear image pixel array 200 may include image pixels 202. As shown, image pixel 202-1 is formed in a first row, and image pixels 202-2 and 202-3 are formed in a second row that is adjacent to the first row. Because array 200 is non-rectilinear, image pixels 202-2 and 202-3 are laterally offset from image pixel 202-1. In other words, centers 204-2 and 204-3 of image pixels 202-2 and 202-3 are not aligned with center 204-1 of image pixel 202-1. This pattern may be repeated across array 200, resulting in a non-rectilinear array in which centers of pixels in adjacent rows are not aligned. Centers of pixels in every other row may be aligned, however, as illustrated by centers 204-1 and 204-5. While image pixels 202 are circular in FIG. 2A, this is merely illustrative. As shown in FIG. 2B, image pixels 202 may be hexagonal image pixels arranged in non-rectilinear array 200. Image pixels 202 may be triangular, rhombic, trapezoidal, pentagonal, octagonal, or any other desired shape.

Image pixel array 200 may be formed from red, green, and blue image pixels 202 that generate charge in response to red, green, and blue light. The red, green, and blue image pixels may be arranged in a non-rectilinear Bayer mosaic pattern. As previously described, a non-rectilinear array may have adjacent pixels laterally offset from one another (e.g., the centers of adjacent image pixels may not be aligned). The Bayer mosaic pattern consists of a repeating unit cell of two-by-two image pixels, with two green image pixels diagonally opposite one another and adjacent to a red image pixel diagonally opposite to a blue image pixel. In a non-rectilinear array, the Bayer pattern may also have repeating sections of RGB pixels 202, as shown in FIG. 2B. However, this is merely illustrative. If desired, image pixel array 200 may be formed from two types of image pixels, such as red and blue image pixels (e.g., rather than red, green, and blue image pixels). In general, image pixel array 200 may include cyan image pixels, magenta image pixels, yellow image pixels, infrared (IR) image pixels, ultraviolet (UV) image pixels, or clear image pixels.

Figure 2C:
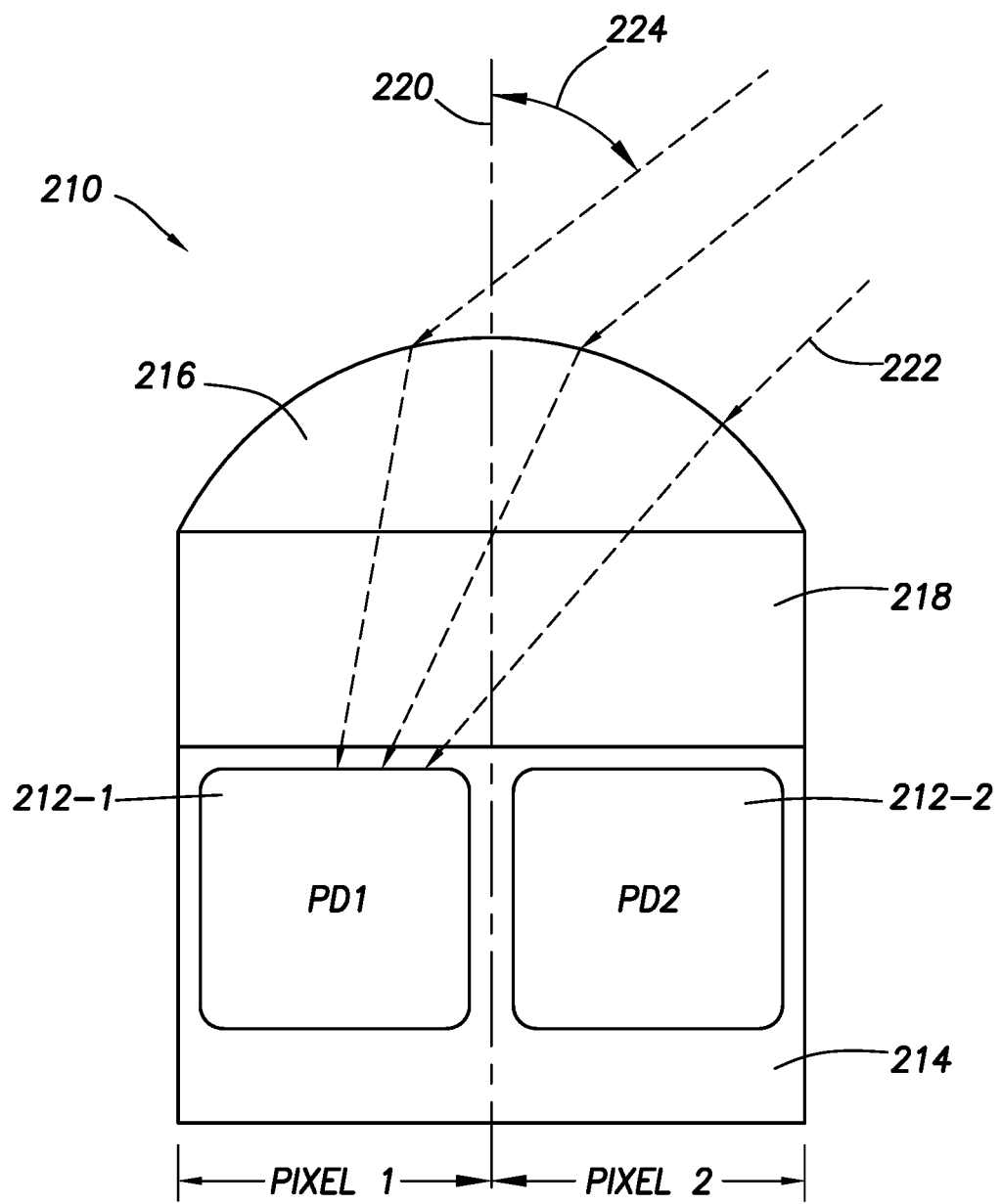
FIG. 2C is a cross-sectional side view of illustrative phase detection pixels having photosensitive regions with different and asymmetric angular responses in accordance with an embodiment.

FIG. 2C is an illustrative cross-sectional side view of two image pixels of pixel array 200. In FIG. 2C, the two image pixels form pixel pair 210. Pixel pair 210 may include first and second pixels such Pixel 1 and Pixel 2. Pixel 1 and Pixel 2 may include photosensitive regions such as photosensitive regions 212 formed in a substrate such as silicon substrate 214. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2.

The arrangement of FIG. 2C in which microlens 216 covers two pixel regions may sometimes be referred to as a 2×1 or 1×2 arrangement because there are two phase detection pixels arranged consecutively in a line. In an alternate embodiment, three phase detection pixels may be arranged consecutively in a line in what may sometimes be referred to as a 1×3 or 3×1 arrangement. In other embodiments, phase detection pixels may be grouped in a 2×2 or 2×4 arrangement. In general, phase detection pixels may be arranged in any desired manner.

Color filters such as color filter elements 218 may be interposed between microlens 216 and substrate 214. Color filter elements 218 may filter incident light by only allowing predetermined wavelengths to pass through color filter elements 216 (e.g., color filter 218 may only be transparent to the wavelengths corresponding to a green color, a red color, a blue color, a yellow color, a cyan color, a magenta color, visible light, infrared light, etc.). Color filter 218 may be a broadband color filter. Examples of broadband color filters include yellow color filters (e.g., yellow color filter material that passes red and green light) and clear color filters (e.g., transparent material that passes red, blue, and green light). In general, broadband filter elements may pass two or more colors of light. Photodiodes PD1 and PD2 may serve to absorb incident light focused by microlens 216 and produce pixel signals that correspond to the amount of incident light absorbed.

Photodiodes PD1 and PD2 may each cover approximately half of the substrate area under microlens 216 (as an example). By only covering half of the substrate area, each photosensitive region may be provided with an asymmetric angular response (e.g., photodiode PD1 may produce different image signals based on the angle at which incident light reaches pixel pair 210). The angle at which incident light reaches pixel pair 210 relative to a normal axis 220 (i.e., the angle at which incident light strikes microlens 216 relative to normal optical axis 220 of lens 216) may be herein referred to as the incident angle or angle of incidence.

An image sensor can be formed using front side illumination imager arrangements (e.g., when circuitry such as metal interconnect circuitry is interposed between the microlens and photosensitive regions) or backside illumination imager arrangements (e.g., when the photosensitive regions are interposed between the microlens and the metal interconnect circuitry). The example of FIG. 2C in which Pixels 1 and 2 are backside illuminated image sensor pixels is merely illustrative. If desired, Pixels 1 and 2 may be front side illuminated image sensor pixels. Arrangements in which pixels are backside illuminated image sensor pixels are sometimes described herein as an example.

In the example of FIG. 2C, incident light 222 may originate from the right of normal axis 220 and may reach pixel pair 210 with an angle 224 relative to normal axis 220. Angle 224 may be considered a positive angle of incident light. Incident light 222 that reaches microlens 216 at a positive angle such as angle 224 may be focused towards photodiode PD1. In this scenario, photodiode PD1 may produce relatively high image signals, whereas photodiode PD2 may produce relatively low image signals (e.g., because incident light 222 is not focused towards photodiode PD2). However, this is merely an example. Incident light 222 may instead originate from the left of normal axis 220 and reach pixel pair 210 with a negative angle of incident light, and may be focused towards photodiode PD2 (e.g., the light is not focused towards photodiode PD1). In this scenario, photodiode PD1 may produce an image signal output that is relatively low, whereas photodiode PD2 may produce an image signal output that is relatively high.

The positions of photodiodes PD1 and PD2 may sometimes be referred to as asymmetric or displaced positions because the center of each photosensitive area 212 is offset from (i.e., not aligned with) optical axis 220 of microlens 216. Due to the asymmetric formation of individual photodiodes PD1 and PD2 in substrate 214, each photosensitive area 212 may have an asymmetric angular response (e.g., the signal output produced by each photodiode 212 in response to incident light with a given intensity may vary based on an angle of incidence). It should be noted that the example of FIG. 2C where the photodiodes are adjacent is merely illustrative. If desired, the photodiodes may not be adjacent (i.e., the photodiodes may be separated by one or more intervening photodiodes).

Output signals from pixel pairs such as pixel pair 210 may be used to adjust the optics (e.g., one or more lenses such as lenses 28 of FIG. 1) in image sensor 14 during automatic focusing operations. The direction and magnitude of lens movement needed to bring an object of interest into focus may be determined based on the output signals from pixel pairs 210.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel blocks that are used to determine phase difference information such as pixel pair 210 are sometimes referred to herein as phase detection pixels, depth-sensing pixels, or phase detection autofocusing ("PDAF") image sensor pixels.

A phase difference signal may be calculated by comparing the output pixel signal of PD1 with that of PD2. For example, a phase difference signal for pixel pair 210 may be determined by subtracting the pixel signal output of PD1 from the pixel signal output of PD2. For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

In accordance with another embodiment, hexagonal image sensor pixels can also be subdivided into light collecting regions having multiple phase detecting regions to provide both high dynamic range (HDR) and PDAF functionality. Pixel 202 of FIG. 2D may include a first sub-pixel 230-1, which may be referred to as the inner sub-pixel. Inner sub-pixel 230-1 may be completely surrounded by a second sub-pixel 230-2, which may be referred to as the outer sub-pixel.

In the example of FIG. 2D, the outer sub-pixel region of pixel 202 may be divided into regions 230-2a and 230-2b. A semi-toroidal microlens 232 may be formed over each pixel 202. Microlens 232 may have a central region 234 (see dotted region in FIG. 2D) surrounded by a semi-toroid region. Configured in this way, image sensor pixel 202 may provide both high dynamic range and phase detecting autofocusing functionalities.

The example of FIG. 2D in which HDR PDAF pixel 202 is divided into two outer sub-regions is merely illustrative and does not serve to limit the scope of the present embodiments. If desired, the outer sub-pixel 230 can be divided into at least three photodiode regions, at least four photodiode regions, at least six photodiode regions, or any suitable number of sub-regions of the same or different shape/area.

Figure 2E:
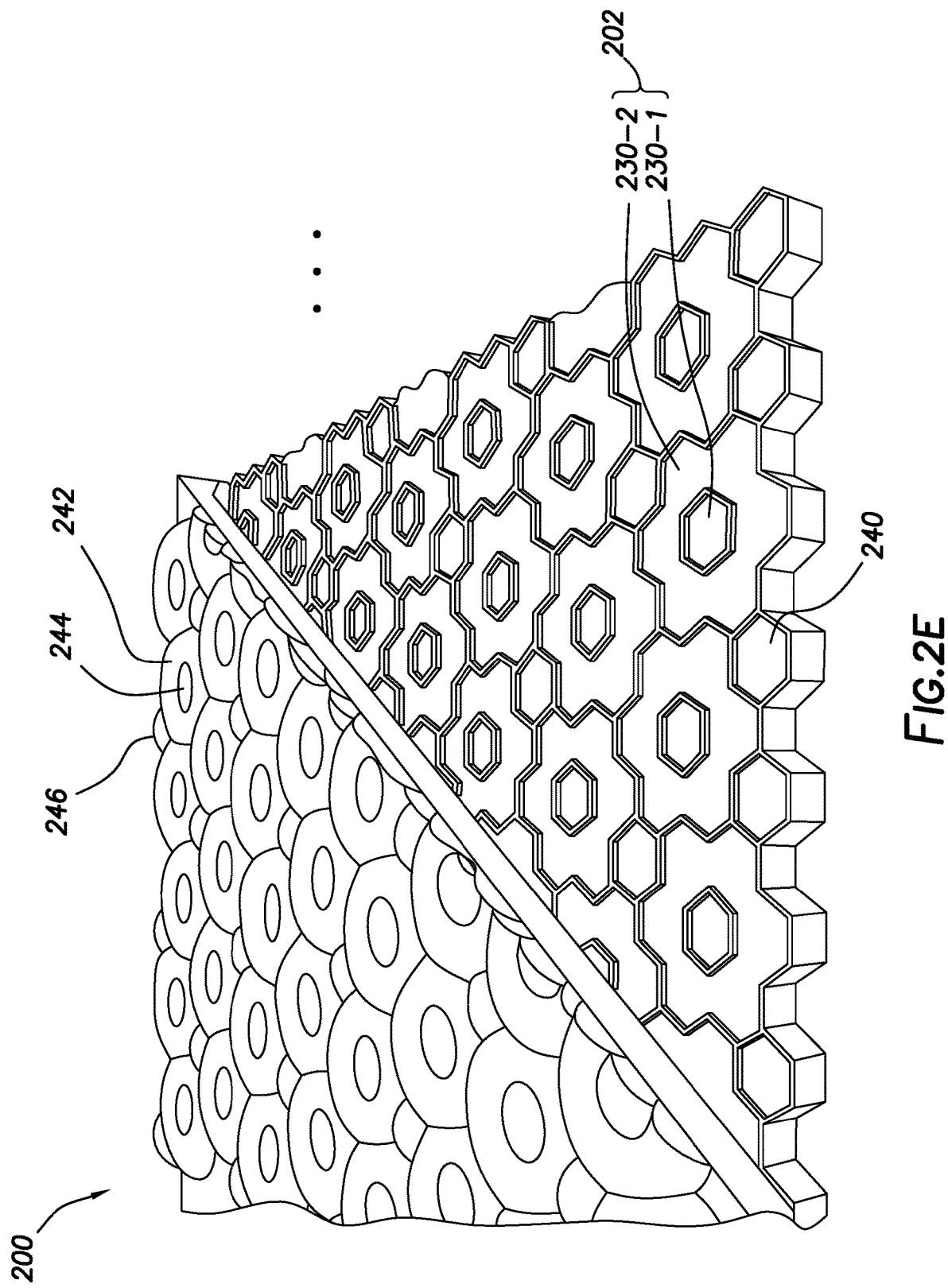
FIG. 2E is a perspective view of an array of non-rectilinear pixels in accordance with at least some embodiments.

In another suitable arrangement, non-rectilinear image pixel array 200 may include redundant pixels that can be used for image data correction. As shown in FIG. 2E, redundant pixels 240 are interposed between image sensor pixels 202. In FIG. 2E, image sensor pixels 202 may be split into inner sub-pixel 230-1 and outer sub-pixel 230-2. As previously discussed, inner sub-pixel 230-1 and outer sub-pixel 230-2 may be used to provide image sensor pixels 202 with HDR functionality. Additionally, image sensor pixels may have seven smaller hexagonal sub-regions and may sometimes be referred to as having a tessellated hexagon group configuration or "snowflake" configuration. However, the shape of image sensor pixels 202 is merely illustrative. Image sensor pixels 202 may be any desired shape. For example, image sensor pixels 202 may be circular or hexagonal image sensor pixels.

Redundant pixels 240 may be distributed throughout pixel array 200, and may be interspersed among image sensor pixels 202. Redundant pixels 240 may be configured to filter light of different wavelengths and may be smaller than snowflake pixels 202. The redundant pixels may be used in a low power mode and/or a low resolution image sensor mode, used as an infrared pixel, ultraviolet pixel, monochrome pixel, or a high light pixel (in HDR mode), etc. Data generated by redundant pixels 240 may be used to check the accuracy of and/or correct image data generated by image sensor pixels 202. For example, the image data from image sensor pixels 202 may be compared to the data generated by redundant pixels 240 by image processing circuitry, such as image processing circuitry 16 of FIG. 1. If the two sets of image data do not match at a particular location of array 200, the image data may be compared to data generated by surrounding image sensor pixels. Image processing circuitry 16 may produce corrected image data (e.g., through averaging sets of image data, substituting sets of image data, or other correction methods), if necessary.

A microlens, such as semi-toroidal microlens 242 of FIG. 2E may be formed over image sensor pixels 202. Microlens 242 may have a central region 244 surrounded by a semi-toroidal region. However, the shape of microlens 242 is merely illustrative. Any type of microlens may be used to cover image sensor pixels 202.

Redundant pixels 240 may also be covered by microlenses, such as microlenses 246. Microlenses 246 may be interspersed between microlenses 242 and may be any desired shape, such as circular or rectangular microlenses. Although FIG. 2E shows microlenses covering pixel array 200, this is merely illustrative. Array 200 may be left uncovered if desired.

Although FIGS. 2A-2E illustrate different shapes and types of pixels that may be used in non-rectilinear image pixel array 200, any shape or type of image sensor pixel may be used, if desired.

Figure 3:
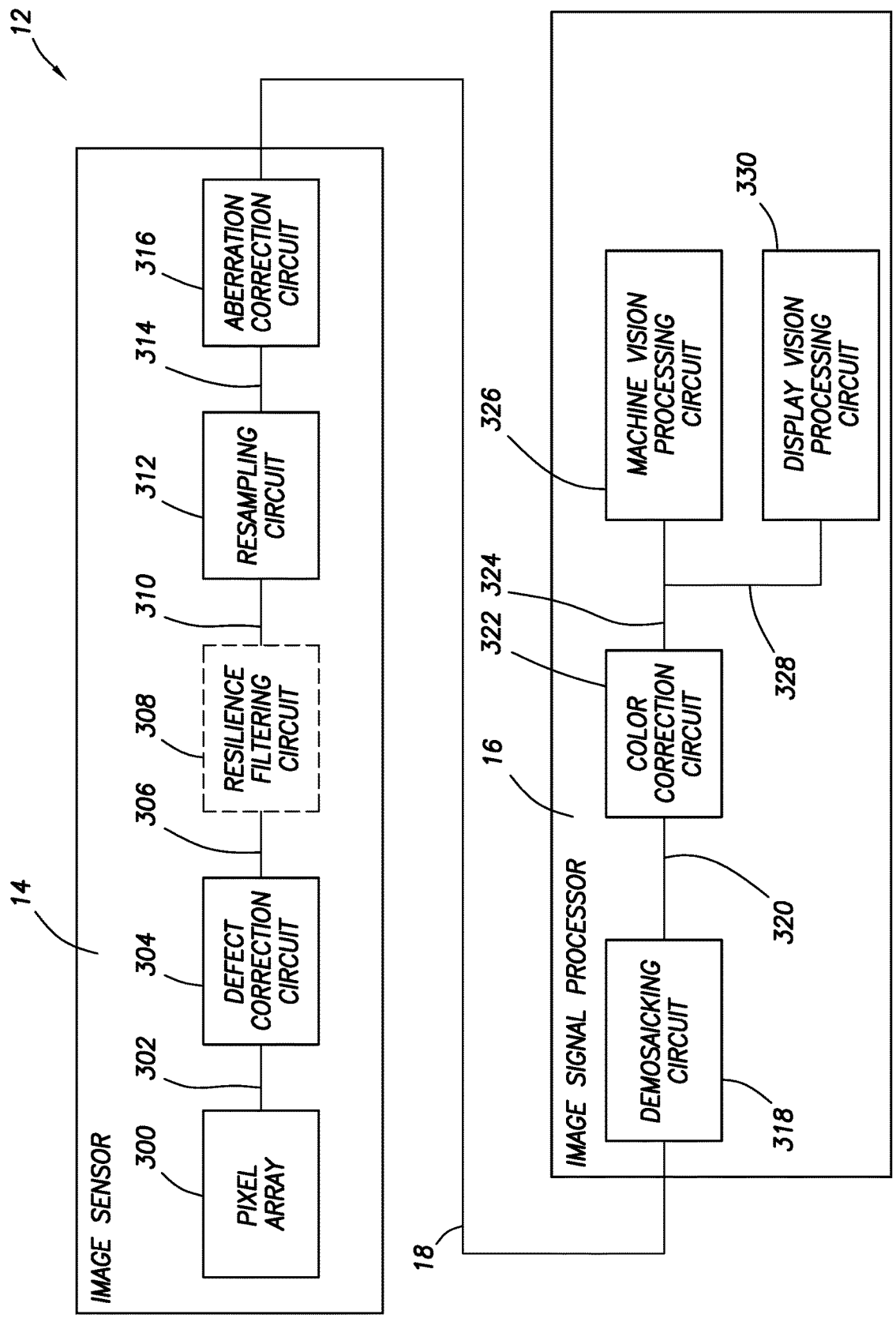
FIG. 3 is a diagram of an illustrative image sensor that has a non-rectilinear pixel array and that outputs rectilinear image data to an image signal processor in accordance with an embodiment.

An illustrative camera module that may include a non-rectilinear image pixel array is shown in FIG. 3. In particular, camera module 12 may include image sensor 14. Image sensor 14 may include pixel array 300, which may be a non-rectilinear image pixel array, such as an array of circular image pixels (FIG. 2A), hexagonal image pixels (FIGS. 2B and 2D), or snowflake image pixels (FIG. 2E). Pixel array 300 may correspond to pixel array 200 of FIGS. 2A-2E. The image pixels within non-rectilinear image pixel array 300 may provide HDR functionality, PDAF functionality, or both HDR and PDAF functionality. However, these are merely examples. In general, any desired image sensor pixels may be incorporated into pixel array 300.

The pixels within pixel array 300 may be configured to generate charge in response to incident light. The generated charge may be converted into image data and output over path 302 to defect correction circuit 304. Defect correction circuit 304 may analyze the image data from pixel array 300 and correct any defects. For example, defect correction circuit 304 may compare the image data generated by a first pixel, such as pixel 202 of FIG. 2E, within pixel array 300 to image data generated by neighboring or surrounding pixels within pixel array 300. If the image data generated by the first pixel is different from the image data generated by the surrounding pixels, the image data may be corrected (e.g. by generating new image data for the first pixel location by averaging the image data from the surrounding pixels, by averaging the image data from the first pixel and the surrounding pixels, etc.). In general, the image data may be processed and corrected by defect correction circuit 304 according to any desired method. Defect correction circuit 304 may then output pixel-level corrected image data (also referred to herein as corrected image data) over path 306 to resilience filtering circuit 308. The use of resilience filtering circuit 308 may be optional.

Resilience filtering circuit 308 may perform additional correction operations on the received corrected image data. In particular, resilience filtering circuit 308 may use image data generated by sub-pixels or redundant pixels to correct the image data generated by pixels in pixel array 300. For example, inner sub-pixel 230-1 and redundant pixel 240 of FIG. 2E may be used to correct image data generated by pixel 202 further.

Figure 4:
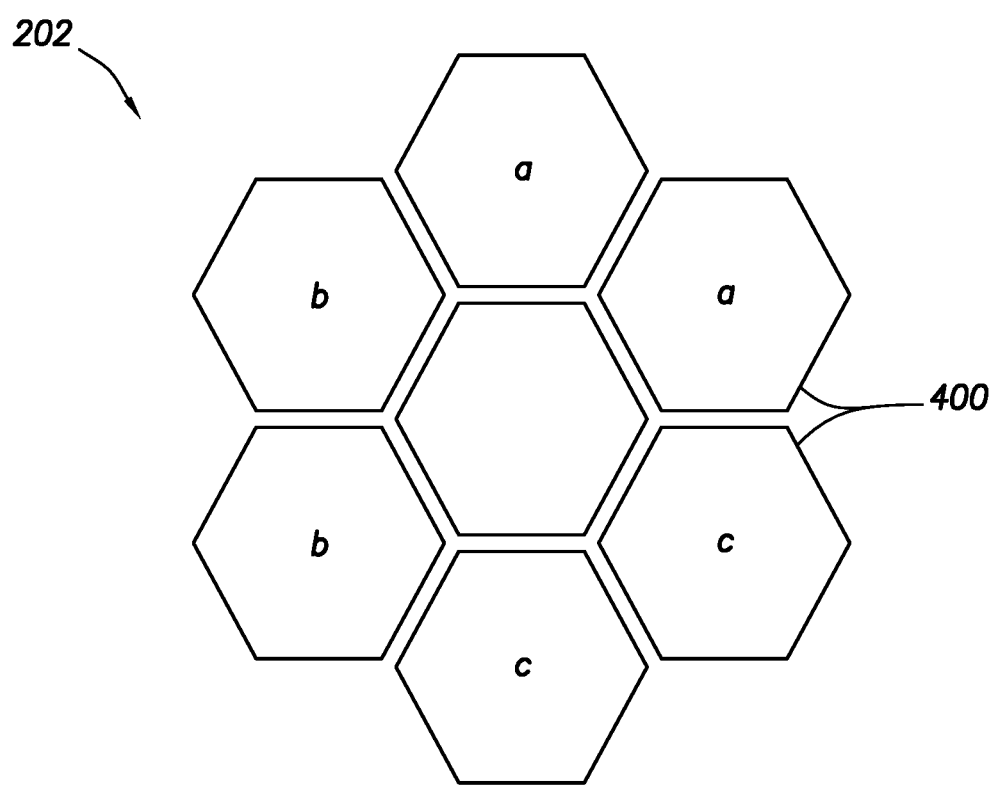
FIG. 4 is a diagram showing how a resilience filtering circuit in an image sensor may correct image pixel data in accordance with at least some embodiments.

Illustrative correction operations that may be performed by resilience filtering circuit 308 are shown in FIG. 4. As shown in FIG. 4, image pixel 202 may include sub-pixels 400. In particular, image pixel 202 may include seven sub-pixels. However, this is merely illustrative. Image pixel 202 may include fewer than seven sub-pixels, greater than seven sub-pixels, or any desired number of sub-pixels. Resilience filtering circuit 308 of FIG. 3 may use image data produced by each of sub-pixels 400 to improve the accuracy and robustness of the image data associated with image pixel 202. For example, resilience filtering circuit 308 may add the charge generated by the sub-pixels labelled "a," add the charge generated by the sub-pixels labelled "b," and add the charge generated by the sub-pixels labelled "c." Resilience filtering circuit 308 may then average these values. For example, resilience filtering circuit 308 may take the median value of the charge generated by sub-pixels "a," sub-pixels "b," and sub-pixels "c." The median value of these three charges may be used to represent the charge generated by image pixel 202. However, this is merely illustrative. If desired, a mean value may be used, or the charge generated by each sub-pixel may be weighted. In general, any desired averaging method may be used.

Although FIG. 4 only illustrates using sub-pixels "a," sub-pixels "b," and sub-pixels "c," this is merely illustrative. If desired, redundant pixels and inner sub-pixels, such as redundant pixel 240 and inner sub-pixel 230-2 of FIG. 2E, may be used when calculating the average charge value at each image pixel 202.

Resilience filtering circuit 308 may make similar calculations for each pixel 202 in pixel array 300 to add robustness to the corrected image data. As shown in FIG. 3, sub-pixel-level corrected image data may then be output over path 310 to resampling circuit 312. Sub-pixel-level corrected image data may also be referred to herein as robust image data or redundant pixel corrected image data. If optional resilience filtering circuit 308 is not included in image sensor 14, defect correction circuit 304 will output corrected image data over path 306 directly to resampling circuit 312.

Resampling circuit 312 may then provide further corrections to the robust image data or the corrected image data. For example, resampling circuit 312 may include image transformation circuitry that is configured to de-warp the image data. Resampling circuit 312 may be referred to as a de-warping circuit, undistorting circuit, or image transformation circuit and may produce de-warped image data, undistorted image data, or transformed image data. An illustrative example of resampling circuit 312 being used to de-warp image data can be seen in fisheye lens applications. Fisheye lenses produce a warped image that has strong visual distortion. Resampling circuit 312 may transform the image data produced by an image sensor having a fisheye lens to de-warp the data and create a flat undistorted image. Similar processes can be used by resampling circuit 312 regardless of the type of lens used (e.g., resampling circuit 312 may be used to reduce the amount of distortion the image data produced by a lens that outputs a flat image).

In general, resampling circuit 312 is configured to reduce the amount of distortion and warpage and produce undistorted image data. When a non-rectilinear image pixel array is used in image sensor 14, resampling circuit 312 may transform the image data produced by the pixel array into rectilinear image data, if desired. This may be done by representing the image data produced by a non-rectilinear image pixel array in a traditional, rectilinear set. As shown in FIG. 3, resampling circuit 312 may the output the rectilinear image data over path 314 to aberration correction circuit 316.

Aberration correction circuit 316 may perform wavelength correction operations on the rectilinear image data. For example, aberration correction circuit 316 may compare the wavelengths of light captured by pixel array 300 to known or expected wavelength values (e.g., based on the setting in which the image was taken, manual user input, or automatic calibration). The rectilinear image data may then be corrected by modifying the data to reflect desired wavelength values, and wavelength-corrected rectilinear image data may be produced. Although aberration correction circuit 316 and resampling circuit 312 are shown as separate circuits in FIG. 3, this is merely illustrative. Aberration correction circuitry and resampling circuitry may be combined into a single circuit if desired.

As shown in FIG. 3, the wavelength-corrected rectilinear image data may then be output over path 18 to image signal processor 16. Image signal processor 16 may include demosaicking circuit 318, which may receive the wavelength-corrected rectilinear image data over path 18. Demosaicking circuit 318 may be configured to calculate color values for each pixel location within pixel array 300. In particular, while each pixel in pixel array 300 may generate charge in response to light of a specific wavelength (e.g., a specific color), data from surrounding pixels can be used to approximate color values at each pixel location. For example, pixel array 300 may include red, green, and blue image pixels that respectively generate charge in response to red, green, and blue light. Demosaicking circuit 318 may then approximate red, green, and blue image data values at each pixel location across pixel array 300 to output RGB image data. In general, however, demosaicking circuit 318 may produce image data in any desired color space. For example, demosaicking circuit 318 may produce YUV image data (e.g., data in a luminance/chrominance color space).

Figure 5A:
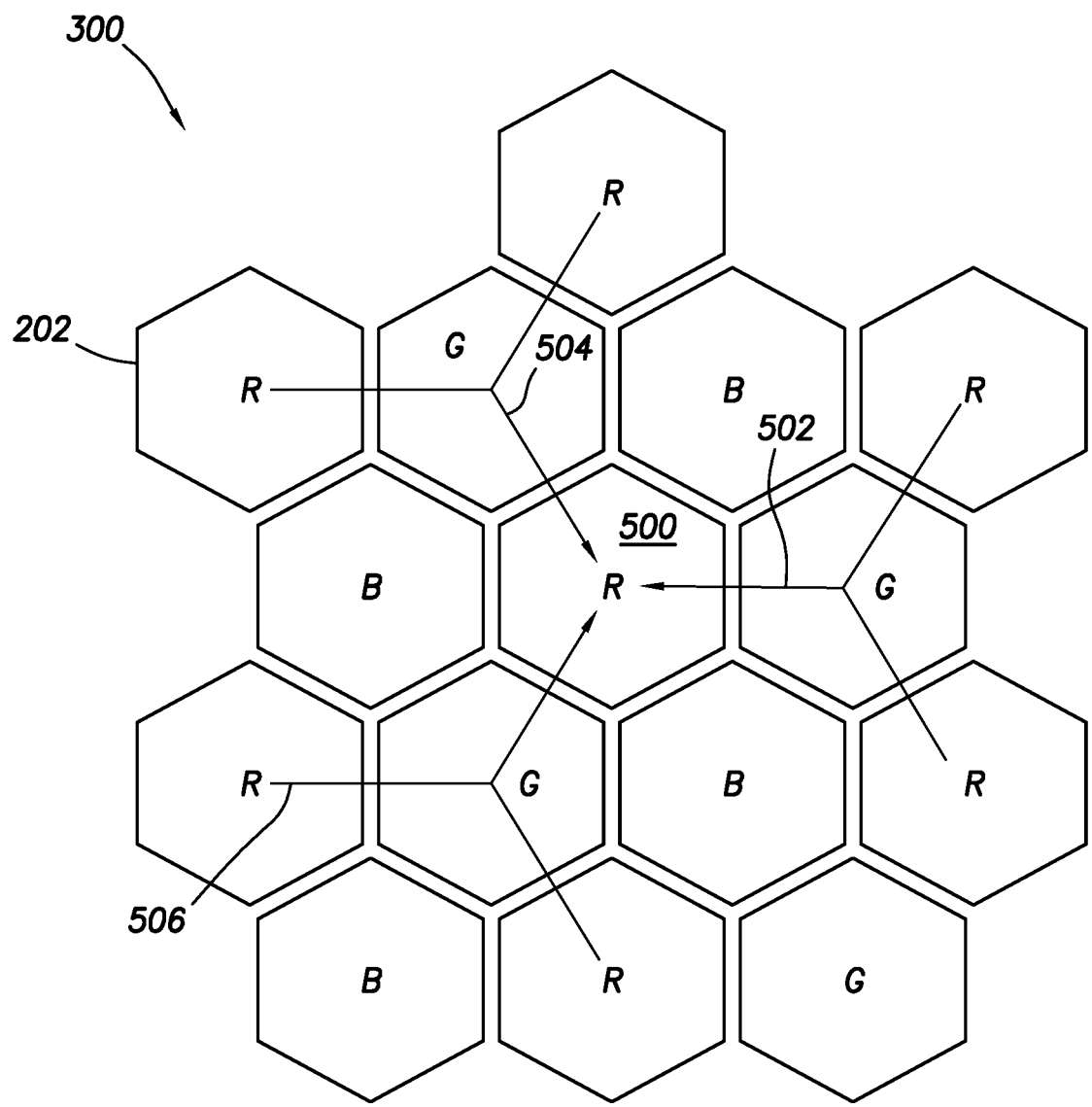
FIG. 5A is a diagram showing how a demosaicking circuit may approximate pixel values based on the pixel values of surrounding pixels in accordance with at least some embodiments.

An example of operations performed by demosaicking circuit 318 is shown in FIG. 5A. As shown in FIG. 5A, pixel array 300 may include red, green, and blue pixels 202 that generate charge and produce image signals in response to red, green, and blue light. Demosaicking circuit 318 may approximate red, green, and blue values at each pixel location in array 300. For example, it may be desired to approximate the amount of green light incident on pixel 500. As shown in FIG. 5A, pixel 500 may be a red image pixel. As a result, demosaicking circuit 318 must approximate the amount of green light incident on pixel 500 based on image data produced by surrounding pixels. Due to the non-rectilinear nature of array 300, demosaicking circuit 318 may make this approximation from three different directions, as indicated by arrows 502, 504, and 506. An approximation in a first of the three directions (e.g., along arrow 502) is shown in FIG. 5B.

Figure 5B:
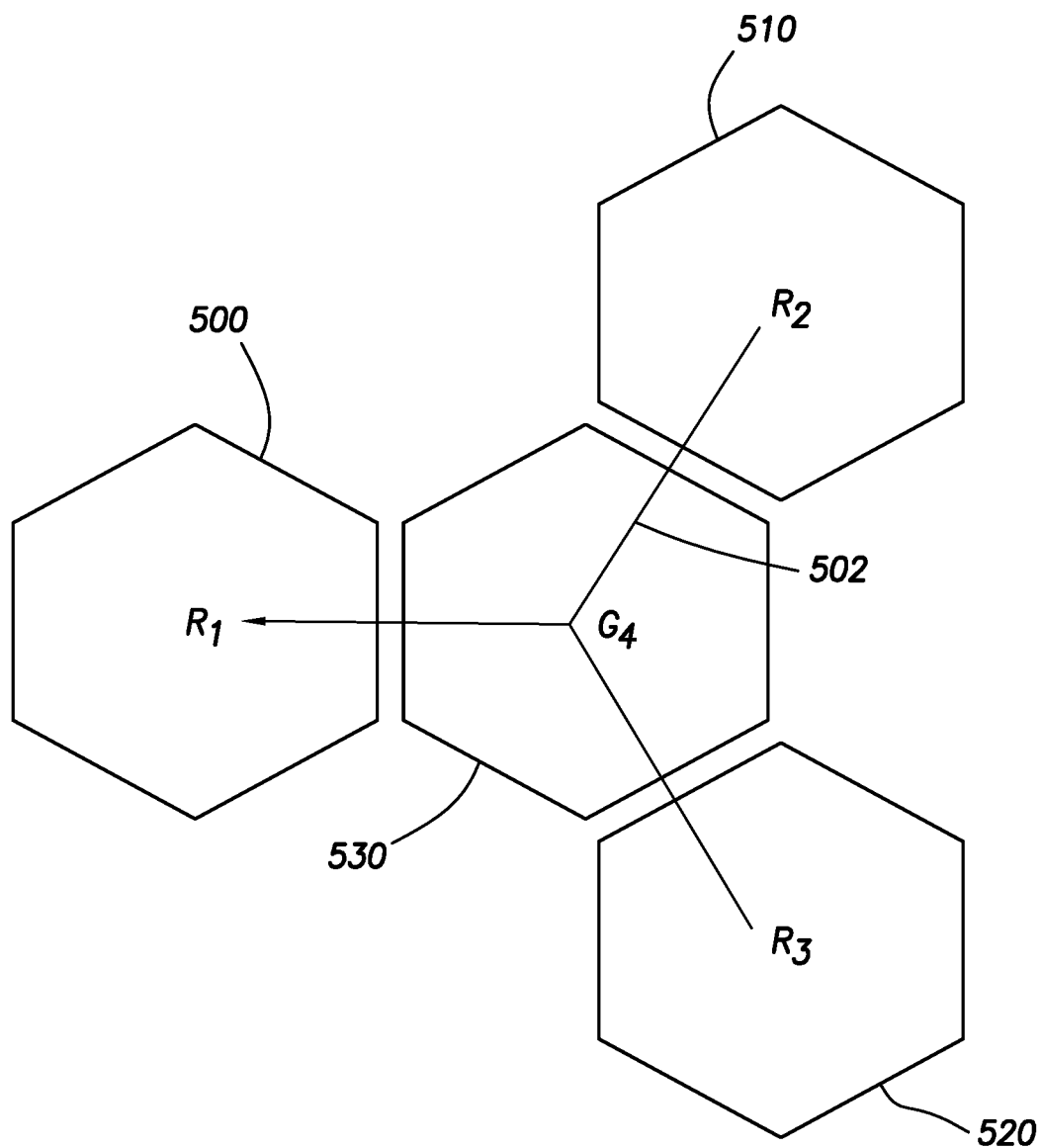
FIG. 5B is a diagram illustrating how a demosaicking circuit may approximate pixel values at a particular location in a pixel array in accordance with at least some embodiments.

As shown in FIG. 5B, a green value at first red pixel 500 can be approximated using the image data produced by second red pixel 510, third red pixel 520, and green pixel 530. The red values produced by the first, second, and third red pixels are respectively indicated as $R_1$, $R_2$, and $R_3$. The green value produced by the green pixel is indicated as $G_4$. Given each of these red and green values, a green value at first red pixel 500, can be approximated by equation (1):

$$G_1 = (R_1 - (R_2 + R_3)/2))/2 + G_4 \quad (1)$$

where $G_1$ is a first approximate green value at first red pixel 500.

Demosaicking circuit 318 may perform similar operations along arrows 504 and 506 to determine second and third approximate green values at first red pixel 500. The first, second, and third approximate green values may then be averaged to determine a green value for first red pixel 500. Demosaicking circuit 318 may repeat this process to approximate red, green, and blue image data for each of the image pixels in array 300. While red, green, and blue image pixels and RGB demosaicking are illustrated in FIGS. 5A and 5B, these are merely illustrative. Any desired image pixels may be used in pixel array 300, and demosaicking circuit 318 may be used to determine missing values at each pixel location to produce demosaicked image data.

Once demosaicking operations have completed, demosaicking circuit 318 may output demosaicked image data over path 320 to color correction circuit 322, as shown in FIG. 3. Color correction circuit 322 may apply a color correction matrix (CCM) to the demosaicked image data. The CCM may, for example, extract additional image data from the demosaicked image data. For example, if only red and blue image pixels are used in pixel array 300, the CCM may extract green image data from the red and blue image data to generate red, green, and blue image data. The CCM may convert the image data into standard red, standard green, and standard blue image data (sometimes referred to collectively as linear sRGB image data or simply sRGB image data). In some cases, it may be desirable to provide additional noise reduction (e.g., by applying a point filter to the sRGB image data) to further mitigate the noise amplification generated by applying the CCM to the image data. Following the desired color correction steps, color correction circuit 322 may output color corrected image data.

As shown in FIG. 3, the color corrected image data may be output over path 324 or over path 328. If the image data is to be used in machine vision applications, the color corrected image data may be sent over path 324 to machine vision processing circuit 326. Machine vision processing circuit 326 may then process the image data for use in any desired machine vision application, such as convolutional neural networks (CNNs) or convolutional deep neural networks (CDNNs). For example, machine vision processing circuitry 326 may produce image data that is readable by CNNs, CDNNs, or other machine vision applications (e.g., machine-readable image data). CNNs and CDNNs can use the image data in safety applications. For example, automotive CNNs may use the image data to evaluate safety conditions.

Alternatively, if the image data is to be used in display vision applications, the color corrected image data may be sent over path 328 to display vision processing circuit 330. Display vision processing circuit 330 may prepare the image data to be viewed by a user. For example, display vision processing circuit 330 may produce display-compatible image data. The image data may then be output the image data to a display associated with electronic device 10 of FIG. 1 or to a display associated with an external device.

While the processing circuitry described above in connection with FIG. 3 may be useful to correct image data for viewing by a user (e.g., by providing color correction, demosaicking, etc.), image data may be used in machine vision applications without performing all of the previously described correction steps. In particular, non-rectilinear image data may be directly compatible with machine vision applications, rendering resampling and aberration operations unnecessary.

Figure 6:
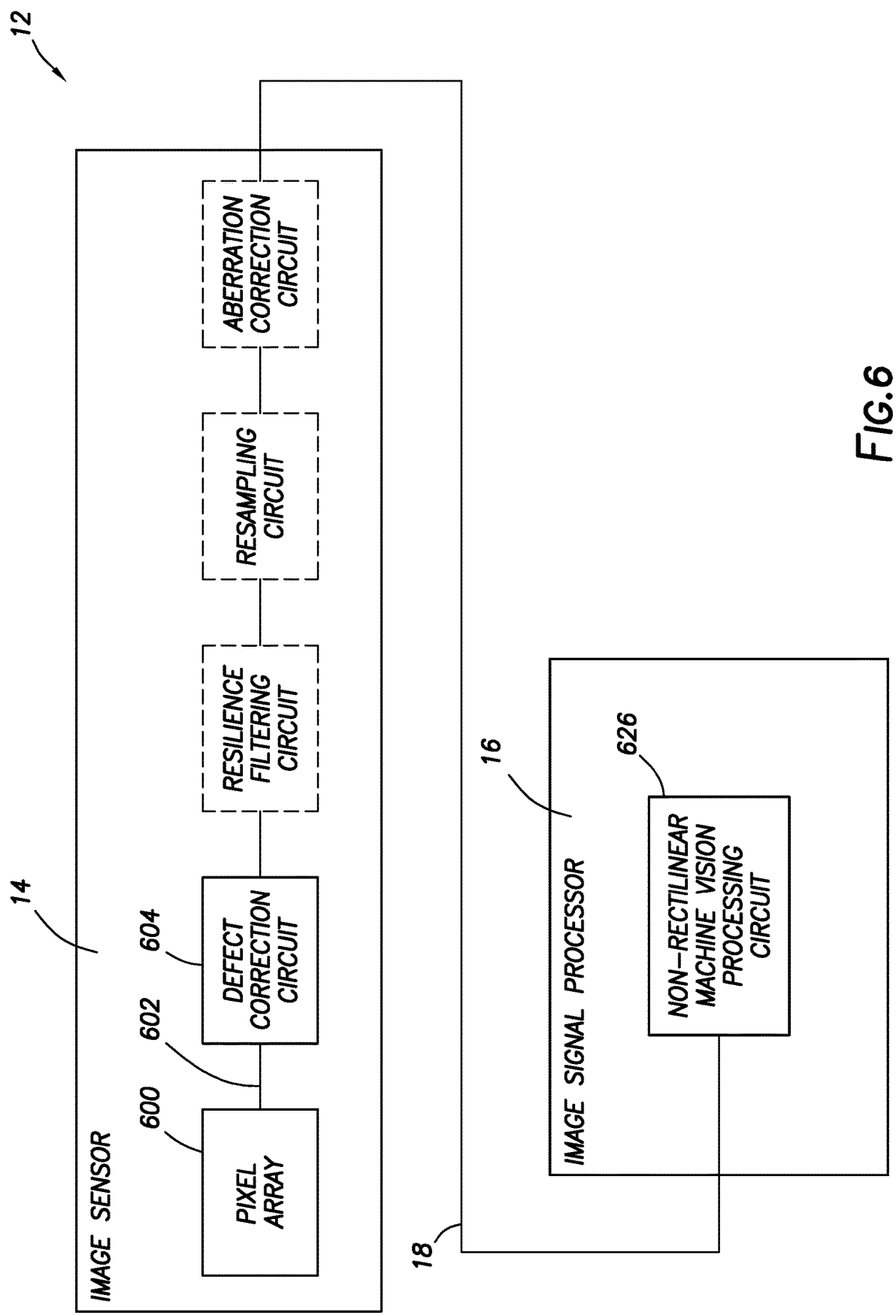
FIGS. 6 and 7 are diagrams of an illustrative image sensor that has a non-rectilinear pixel array and that outputs non-rectilinear image data to an image signal processor in accordance with at least some embodiments.

As shown in FIG. 6, image data produced by pixel array 600 (e.g., a non-rectilinear pixel array) may be corrected by defect correction circuit 604. Defect correction circuit 604 may correct the image data in a similar fashion as previously described in connection with defect correction circuit 304. Optional resilience filtering circuit, resampling circuit, and aberration correction circuit may be optionally bypassed, and corrected image data may be output over path 18 to non-rectilinear machine vision processing circuit 626. Non-rectilinear machine vision processing circuit 626 may receive non-rectilinear image data (e.g., image data that has not passed through resampling circuitry) and prepare the image data for machine vision applications (e.g., by producing machine-readable image data). Illustrative machine vision applications include convolutional neural networks (CNNs) or convolutional deep neural networks (CDNNs). For example, automotive CNNs may use the image data to evaluate safety conditions.

Although non-rectilinear image data may be sent directly to non-rectilinear machine vision processing circuit 626, a resilience filtering circuit, resampling circuit, or aberration correction circuit may be used to correct the non-rectilinear image data at least partially, depending on the desired application.

Figure 7:
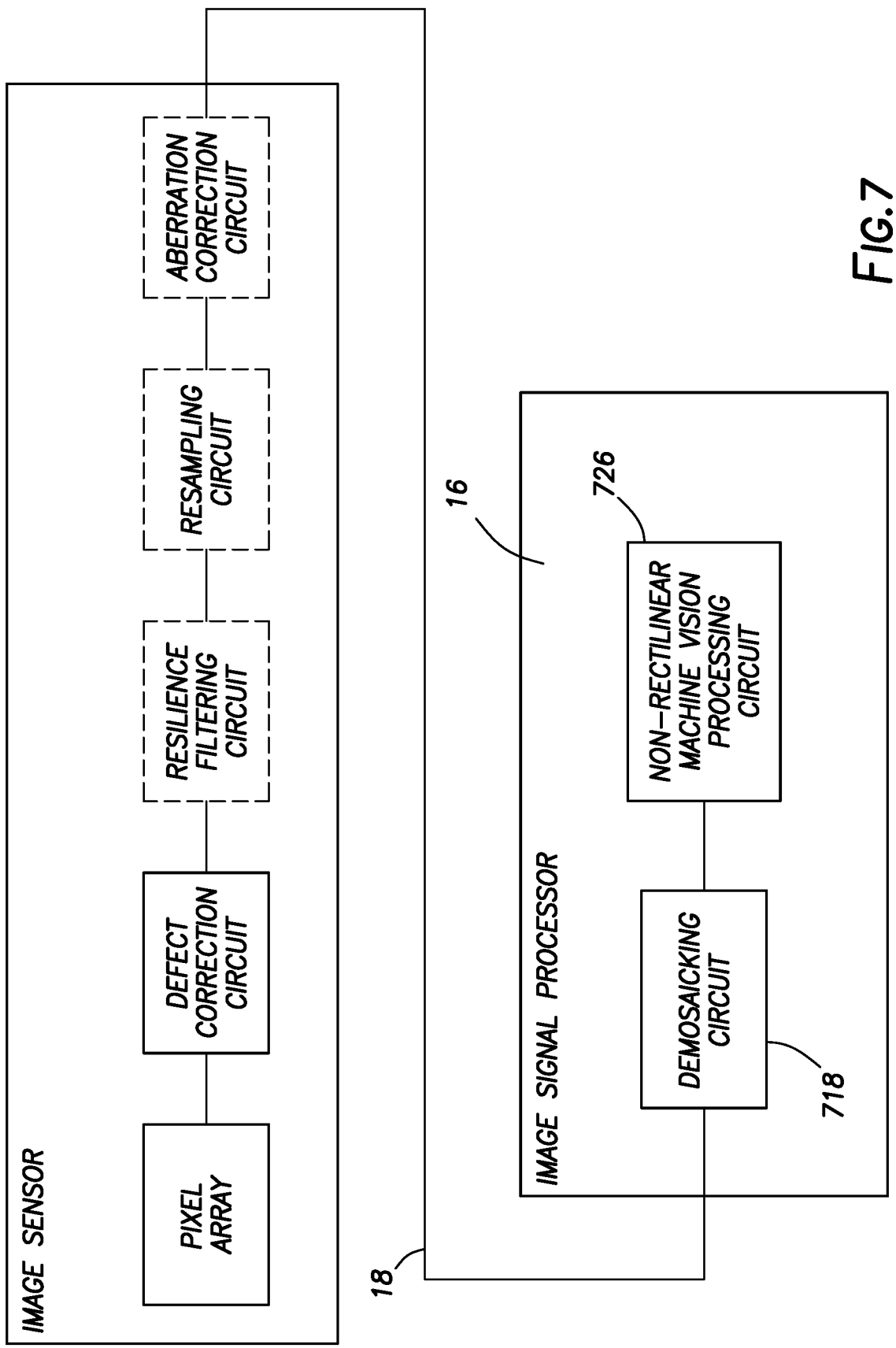

Additionally, in some machine vision applications, it may be desired to output image data in a standard color space, such as RGB or YUV. As shown in FIG. 7, image data received by image signal processor 16 may be processed by demosaicking circuit 718 prior to being sent to non-rectilinear machine vision processing circuit 726. As previously described, demosaicking circuit 718 may approximate image data values at each pixel location across a pixel array. After being demosaicked, the image data may be sent to non-rectilinear machine vision processing circuit 726 to be prepared for machine vision applications.

Various embodiments have been described illustrating image sensors having non-rectilinear pixel arrays. Various image processing techniques (e.g., for machine vision or display vision) have also been described.

In various embodiments, an imaging system may include an image sensor integrated circuit, which may have a non-rectilinear image pixel array that is configured to generate non-rectilinear image data and a resampling circuit configured to convert the non-rectilinear image data into rectilinear image data. The image sensor integrated circuit may further include an aberration correction circuit that is coupled to the resampling circuit and is configured to perform wavelength correction operations on the rectilinear image data.

A resilience filtering circuit may output sub-pixel-level corrected image data to the resampling circuit. The sub-pixel-level corrected image data may be produced by correcting image data produced by image pixels in the non-rectilinear image pixel array using additional image data produced by redundant pixels or sub-pixels in the non-rectilinear image pixel array.

A defect correction circuit may be coupled between the non-rectilinear pixel array and the resampling circuit. The defect correction circuit may produce pixel-level corrected non-rectilinear image data by comparing first pixel data produced by first pixels in the non-rectilinear image pixel array to second pixel data produced by second pixels in the non-rectilinear image pixel array.

In accordance with an embodiment, an image sensor may include a non-rectilinear image pixel array that generates non-rectilinear image data and a de-warping circuit that may be used to correct distortions in the non-rectilinear image data to produce de-warped non-rectilinear image data. This may be done by de-warping or flattening the image data. The de-warped non-rectilinear image data may be output to an image signal processor. A defect correction circuit that corrects the image data may be coupled between the non-rectilinear image pixel array and the de-warping circuit. The defect correction circuit may correct the non-rectilinear image data by comparing first pixel data produced by first pixels in the non-rectilinear image pixel array to second pixel data produced by second pixels in the non-rectilinear image pixel array.

The non-rectilinear image pixel array may include pixels having inner and outer sub-pixels for high dynamic range functionality and having multiple photodiode regions for phase detecting and autofocusing functionality. The pixels in the non-rectilinear image pixel array may be hexagonal image pixels arranged in a non-rectilinear Bayer array.

In various embodiments, an imaging system may include an image sensor and an image signal processor that receives data from the image sensor. The image sensor may include a non-rectilinear image pixel array that produces non-rectilinear image data. The non-rectilinear image pixel array may include a plurality of image pixels and a plurality of redundant image pixels interspersed among the image pixels. The image sensor may also include a defect correction circuit that corrects the non-rectilinear image data based on data from the image pixels.

The image signal processor may include a machine vision processing circuit that processes image data into machine-readable image data and outputs it for use in machine vision applications. The machine vision processing circuit may be coupled to the defect correction circuit, and the defect correction circuit may output non-rectilinear image data to the machine vision processing circuit. A demosaicking circuit in the image signal processor may be coupled between the machine vision processing circuit and the image sensor. The demosaicking circuit may be configured to produce color values for each pixel location within the non-rectilinear pixel array.

The image sensor may also include a resampling circuit that converts the non-rectilinear image data into rectilinear image data. The image signal processor may also include a color correction circuit coupled to the machine vision processing circuit and a display vision processing circuit coupled to the color correction circuit in parallel with the machine vision processing circuit. The display vision processing circuit may process the rectilinear image data into display-compatible image data.

The foregoing is merely illustrative and various modifications can be made to the described embodiments. The foregoing embodiments may be implemented individually or in any combination.

What is claimed is:

1. An image sensor integrated circuit comprising:
   a semiconductor substrate;
   a non-rectilinear image pixel array on the semiconductor substrate and configured to generate non-rectilinear image data;
   a resampling circuit on the semiconductor substrate and configured to convert the non-rectilinear image data into rectilinear image data;
   an aberration correction circuit on the semiconductor substrate and having an input that is coupled directly to an output of the resampling circuit without any intervening circuits, wherein the aberration correction circuit is configured to perform wavelength correction operations on the rectilinear image data; and
   a resilience filtering circuit coupled between the resampling circuit and the non-rectilinear image pixel array, wherein the resilience filtering circuit has an output that is directly coupled to an input of the resampling circuit without any intervening circuits, and wherein the resilience filtering circuit is configured to output sub-pixel-level corrected image data to the resampling circuit.

2. The image sensor integrated circuit defined in claim 1, wherein the resilience filtering circuit is configured to produce the sub-pixel-level corrected image data by correcting image data produced by image pixels in the non-rectilinear image pixel array using additional image data produced by redundant pixels in the non-rectilinear image pixel array.

3. The image sensor integrated circuit defined in claim 1 further comprising:

a defect correction circuit coupled between the non-rectilinear pixel array and the resampling circuit, wherein the defect correction circuit is configured to produce pixel-level corrected non-rectilinear image data from the non-rectilinear image data, wherein the defect correction circuit receives the non-rectilinear image data directly from the non-rectilinear image pixel array, wherein the resilience filtering circuit receives the pixel-level corrected non-rectilinear image data directly from the defect correction circuit, wherein the resampling circuit receives the sub-pixel-level corrected image data directly from the resilience filtering circuit, and wherein the aberration correction circuit receives the rectilinear image data directly from the resampling circuit.

4. The image sensor integrated circuit defined in claim 3 wherein the defect correction circuit is configured to produce the pixel-level corrected non-rectilinear image data by comparing first pixel data produced by first pixels in the non-rectilinear image pixel array to second pixel data produced by neighboring second pixels in the non-rectilinear image pixel array.

5. The image sensor integrated circuit defined in claim 1 further comprising:
   a defect correction circuit coupled between the non-rectilinear pixel array and the resampling circuit, wherein the defect correction circuit is configured to produce pixel-level corrected non-rectilinear image data from the non-rectilinear image data.

6. The image sensor integrated circuit defined in claim 5 wherein the defect correction circuit is configured to produce the pixel-level corrected non-rectilinear image data by comparing first pixel data produced by first pixels in the non-rectilinear image pixel array to second pixel data produced by neighboring second pixels in the non-rectilinear image pixel array.

7. An imaging system configured to generate images in response to light, the imaging system comprising:
   an image sensor integrated circuit, comprising:
      a non-rectilinear pixel array configured to generate non-rectilinear image data, wherein the non-rectilinear pixel array comprises a plurality of image pixels and a plurality of redundant pixels interspersed among the plurality of image pixels,
      a defect correction circuit coupled to the non-rectilinear pixel array and configured to produce corrected non-rectilinear image data from the non-rectilinear image data based on data from the plurality of image pixels,
      a resampling circuit that converts the non-rectilinear image data into rectilinear image data,
      a resilience filtering circuit coupled between the resampling circuit and the non-rectilinear image pixel array, wherein the resilience filtering circuit has an output that is directly coupled to an input of the resampling circuit without any intervening circuits, and wherein the resilience filtering circuit is configured to output sub-pixel-level corrected image data to the resampling circuit, and
      an aberration correction circuit that performs wavelength correction operations on the rectilinear image data, wherein an input of the aberration correction circuit is directly coupled to the resampling circuit without any intervening circuits; and
   an image signal processor configured to receive data from the image sensor integrated circuit.

8. The imaging system defined in claim 7, wherein the image signal processor comprises a machine vision processing circuit.

9. The imaging system defined in claim 8, wherein the image signal processor further comprises a demosaicking circuit coupled between the machine vision processing circuit and the image sensor integrated circuit and wherein the demosaicking circuit is configured to produce color values for each pixel location within the non-rectilinear pixel array.

10. The imaging system defined in claim 8, wherein the image sensor integrated circuit further comprises a resampling circuit configured to convert the non-rectilinear image data into rectilinear image data, and wherein the defect correction circuit receives the non-rectilinear image data from the non-rectilinear pixel array.

11. The imaging system defined in claim 10 wherein the image signal processor further comprises:
   a color correction circuit coupled to the machine vision processing circuit; and
   a display vision processing circuit coupled to the color correction circuit in parallel with the machine vision processing circuit, wherein the display vision processing circuit is configured to process the rectilinear image data and produce display-compatible image data.

* * * * *